United States Patent [19]

Shigenari

[11] Patent Number: 5,172,079
[45] Date of Patent: Dec. 15, 1992

[54] BALANCED MODULATOR DESIGNED FOR LOW SUPPL VOLTAGE

[75] Inventor: Toshihiko Shigenari, Nara, Japan

[73] Assignee: Sharp Kabushiki Kaisha, Osaka, Japan

[21] Appl. No.: 851,970

[22] Filed: Mar. 16, 1992

[30] Foreign Application Priority Data

Oct. 30, 1991 [JP] Japan .................. 3-284885

[51] Int. Cl.⁵ .............................................. H03C 1/54
[52] U.S. Cl. .................................. 332/168; 332/178; 455/109; 455/333
[58] Field of Search ............... 332/168, 170, 178, 167; 455/46, 47, 108, 109, 333

[56] References Cited

U.S. PATENT DOCUMENTS 4,278,954  7/1981  Fujisaki ........................ 332/168 X
4,344,188  8/1982  Tanabe et al. ................. 455/333 X

OTHER PUBLICATIONS

Alan B. Grebene, "Analog Integrated Circuit Design" (published by Litton Educational Publishing Inc. 1972), translated by S. Nakazawa, et al. pp. 236-238, Kindai--Kagaku Ltd., Tokyo 1975.

Primary Examiner—Siegfried H. Grimm

[57] ABSTRACT

A balanced modulation circuit includes first, second, and third differential amplifiers. The first differential amplifier includes first and second transistors (Q11, Q12) having the emitters connected to first and second constant-current sources (CS11, CS12) and also connected with each other through a resistor, the collectors connected to the power supply line through respective base-collector-coupled transistors (Q13, Q14) used as diodes, and the bases connected to a first voltage source (V11) through respective resistors (R11, R12). The second differential amplifier includes third and fourth transistors (Q17, Q18) having the emitters connected to the collector of a transistor (Q15) whose base is connected to the base of the transistor (Q14) and whose emitter is connected to the power supply line, the bases of the third and fourth transistors (Q17, Q18) are connected to a second voltage source (V12) through respective resistors, and the collectors are connected to the ground line through respective resistors. The third differential amplifier includes fifth and sixth transistors (Q19, Q20) having the emitters connected to the collector of a transistor (Q16) whose base is connected to the base of the transistor (Q13) and whose emitter is connected to the power supply line, the bases of the fifth and sixth transistors (Q19, Q20) are respectively connected to the bases of the fourth and third transistors (Q18, Q17), and the collectors are respectively connected to the collectors of the third and fourth transistors (Q17, Q18).

4 Claims, 2 Drawing Sheets

BALANCED MODULATOR DESIGNED FOR LOW SUPPL VOLTAGE

BACKGROUND OF THE INVENTION

1. Field of the Invention

The present invention relates to a balanced modulation circuit. More particularly, the invention relates to a balanced modulation circuit which operates on a low supply voltage and which has a wide output dynamic range.

2. Description of the Related Art

The balanced modulation circuit is used extensively in analog communication and as a frequency conversion circuit. FIG. 1 is a circuit diagram of a well-known balanced modulation circuit, shown, for example, in Alan B. Grebene (Exar Integrated System, Inc. Sunnyvale, Calif.), 'Analog Integrated Circuit Design', FIG. 7.3.

In FIG. 1, a first differential amplifier comprises transistors Q21 and Q22, an input resistor R23, and constant-current sources CS21 and CS22, a second differential amplifier comprises transistors Q23 and Q24, and a resistor R25 for output level, and a third differential amplifier comprises transistors Q25 and Q26, and a resistor R26 for output level. An input terminal 21 is connected through a coupling capacitor C21 to the base of the transistor Q21, an input terminal 22 is connected through a coupling capacitor C22 to the base of the transistor Q23, and an output terminal 23 is connected to the collector of the transistor Q26.

The operation of the well-known balanced modulation circuit will be described.

The operation as a frequency conversion circuit is to input a modulating signal expressed by the equation (1) from the input terminal 21, and a carrier wave signal also expressed by the equation (1) from the input terminal 22.

$$Vm = Em \text{ COS } (\omega m t)$$
$$Vc = Ec \text{ COS } (\omega c t) \quad (1)$$

where Em is the amplitude of the modulating signal Vm, Ec is the amplitude of the carrier wave signal Vc, $\omega m$ is the angular frequency of the modulating signal Vm, $\omega c$ is the angular frequency of the carrier wave signal Vc, and t is time.

If the modulating signal Vm and the carrier wave signal Vc are applied to the input terminals 21 and 22, a set of the transistors Q23 and Q26 and a set of the transistors Q24 and Q25 turn on and off alternately at every half cycle of the carrier wave signal Vc. On the other hand, with the modulating wave signal Vm, the transistor Q21 conducts in proportion to the amplitude Em of the modulating wave signal and the transistor Q22 conducts in inverse proportion to the amplitude Em, so that the output voltage Vo is given by $$\begin{aligned} Vo &= K \, Em \text{ COS } (\omega \, mt) \, Ec \text{ COS } (\omega \, ct) \\ &= (K/2) \, Em \, Ec \, \{\text{COS } (\omega \, c + \omega \, m)t + \\ &\quad \text{COS } (\omega \, c - \omega \, m)t\} \end{aligned} \quad (2)$$

where K is a constant.

From the equation (2), the frequency component of the carrier wave signal does not appear at the output Vo, but only the sum and difference components of the two input signal frequencies appear, from which it is known that frequency conversion has been done.

If the voltage drop of the resistors R25 and R26 is VR, the collector-emitter voltage of the transistors Q21 and Q23 is 0.4 V and the voltage across the constant-current source CS21 is 0.4 V, the minimum operating voltage Vcc$_{MIN}$ of this circuit can be obtained as:

$$\begin{aligned} Vcc_{MIN} &= V(CS21) + Vce(Q21) + \\ &\quad Vce(Q23) + VR = 1.2 + VR(V) \end{aligned} \quad (3)$$

Supposing VR = 1 V in this equation (3), $$Vcc_{MIN} = 2.2 \, V.$$

When the balanced modulation circuit is integrated into a battery-driven integrated circuit device, it is desirable to construct the integrated circuit device so as to operate on a supply voltage of about 1.8 V. If the arrangement mentioned above is used, since Vcc$_{MIN}$ is high, the dynamic range is limited accordingly.

SUMMARY OF THE INVENTION

It is therefore an object of the present invention to provide a balanced modulation circuit which operates on a low supply voltage and which has a wide output dynamic range.

According to the present invention, the above object can be achieved by a balanced modulation circuit comprising first, second, and third differential amplifiers. The first differential amplifier includes first and second transistors having the emitters connected to first and second constant-current sources and also connected with each other through a resistor, the collectors connected to the power supply line through respective base-collector-coupled transistors used as diodes, and the bases connected to a first voltage source through respective resistors. The second differential amplifier includes third and fourth transistors having the emitters connected to the collector of a transistor with the base connected to the base of one of the above-mentioned two base-collector-coupled transistors used as diodes and with the emitter connected to the power supply line, the bases connected to a second voltage source through respective resistors, and the collectors connected to the ground line through respective resistors. The third differential amplifier includes fifth and sixth transistors having the emitters connected to the collector of a transistor with the base connected to the base of the other of the two base-collector-coupled transistors, and with the emitter connected to the power supply line, the bases connected to the bases of the fourth and third transistors of the second differential amplifier, and the collectors connected to the collectors of the third and fourth transistors of the second differential amplifier.

That is to say, the third and fourth transistors of the second differential amplifier have their emitters connected to each other, and the emitters are connected to the collector of the transistor, the emitter of which is connected to the power supply line. The collectors of the third and fourth transistors are connected to the ground line through the respective resistors. The fifth and sixth transistors of the third differential amplifier have their emitter connected to each other. The emitters are connected to the collector of the transistor, the emitter of which is connected to the power supply line. The collectors of the fifth and sixth transistors are respectively connected to the collectors of the third and fourth transistors of the second differential amplifier, and are also connected to the ground line. Therefore, those differential amplifiers are parallel loads with respect to the power supply, and they can be operated on a low supply voltage of 1.8 V. This makes it possible to configure a balanced modulation circuit which permits easy integration and has a wide output dynamic range.

Further objects and advantages of the present invention will be apparent from the following description of the preferred embodiments of the invention as illustrated in the accompanying drawings.

DESCRIPTION OF THE PREFERRED EMBODIMENT

Figure 1:
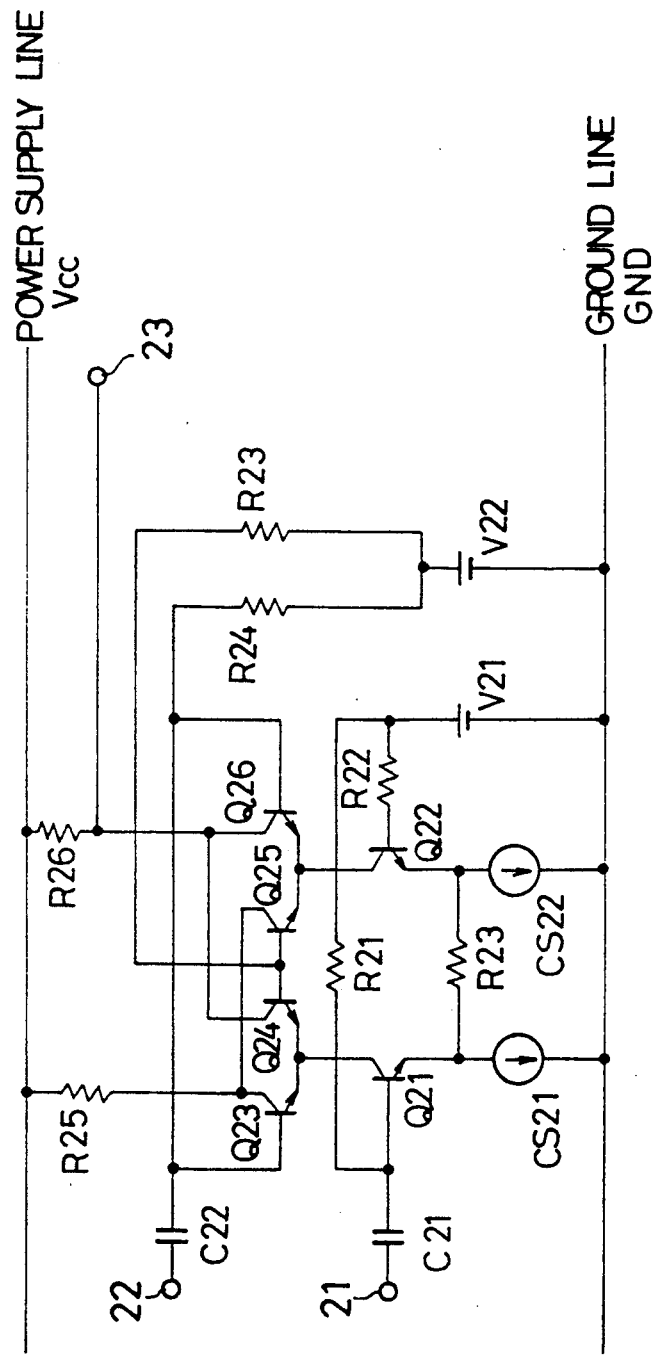
FIG. 1 schematically shows the structure of the well-known balanced modulation circuit.
Figure 2:
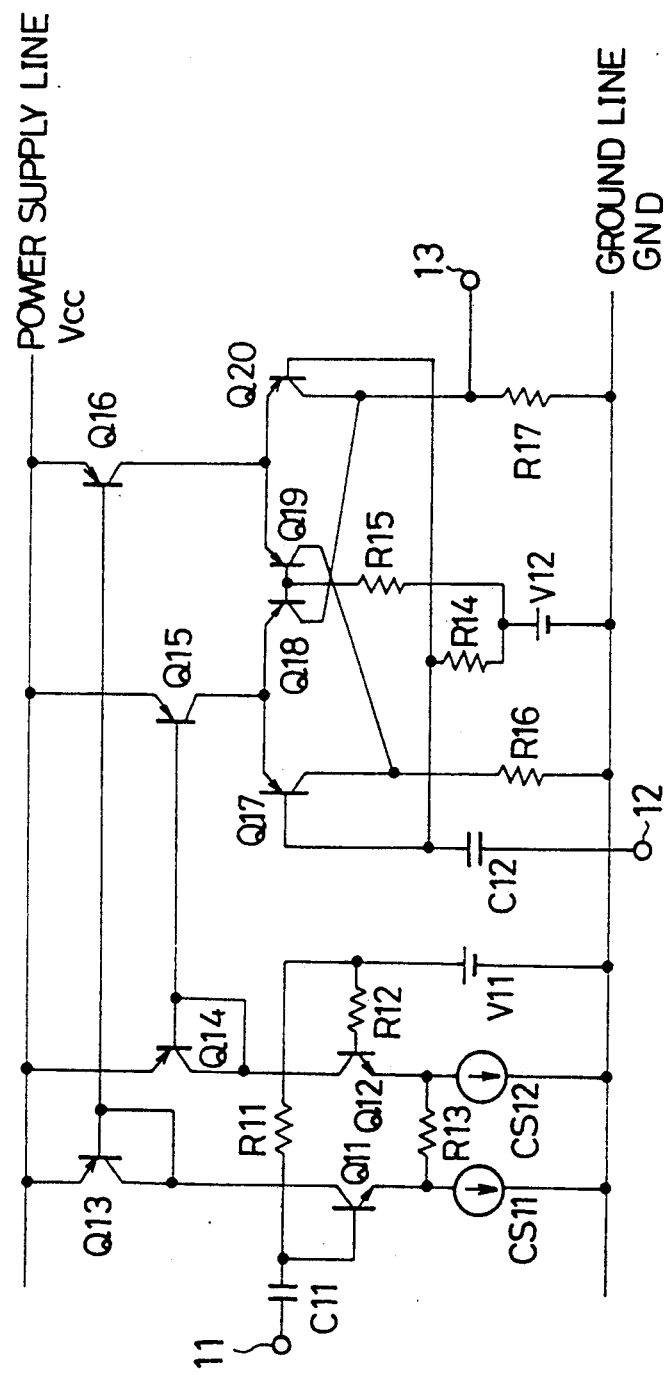
FIG. 2 schematically shows the electrical arrangement of the balanced modulation circuit as a preferred embodiment of the present invention.

FIG. 2 is a circuit diagram of the balanced modulation circuit as a preferred embodiment of the present invention.

As shown in FIG. 2, a first differential amplifier includes first and second transistors Q11 and Q12, an input resistor R13 connected between the emitters of the first and second transistors Q11 and Q12, a first constant-current source CS11 connected to the emitter of the first transistor Q11, and a second constant-current source CS12 connected to the emitter of the second transistor Q12.

The collector of the first transistor Q11 is connected to the power supply line at the supply voltage Vcc through the transistor Q13 wired to operate as a diode. The collector of the second transistor Q12 is connected to the power supply line through the transistor Q14 wired to operate as a diode.

The bases of the first and second transistors Q11 and Q12 are connected to a first voltage source V11 for bias through biasing resistors R11 and R12.

An input terminal 11 for receiving a modulating wave signal is connected to the base of the first transistor Q11 through a coupling capacitor C11 for modulating wave signal.

A second differential amplifier includes third and fourth transistors Q17 and Q18 having their emitters connected to each other, and a resistor R16 for output level connected between the collector of the third transistor Q17 and the ground line GND.

The emitters of the third and fourth transistors Q17 and Q18 are connected to the collector of the transistor Q15. This transistor Q15 has its emitter connected to the power supply line Vcc and its base connected to the base of the transistor Q14 wired to operate as a diode. The transistors Q14 and Q15 constitute a constant-current current mirror circuit.

The bases of the third and fourth transistors Q17 and Q18 are connected to a second voltage source V12 through biasing resistors R14 and R15.

An input terminal 12 for receiving a carrier wave is connected to the base of the third transistor Q17 through a coupling capacitor C12 for receiving the carrier wave.

A third differential amplifier includes fifth and sixth transistors Q19 and Q20 having their emitters connected to each other, and a resistor R17 for output level connected between the collector of the sixth transistor Q20 and the ground line GND.

The emitters of the fifth and sixth transistors Q19 and Q20 are connected to the collector of the transistor Q16. This transistor Q16 has its emitter connected to the power supply line and its base connected to the base of the transistor Q13 wired to serve as a diode. The transistors Q13 and Q16 constitute a constant-current current mirror circuit.

The collectors of the fifth and sixth transistors Q19 and Q20 are connected to the collectors of the transistors Q17 and Q18, respectively.

The base of the fifth transistor Q19 is connected to the base of the fourth transistor Q18, while the base of the sixth transistor Q20 is connected to the base of the transistor Q17.

The collector of the sixth transistor Q20 is connected to an output terminal 13.

Description will be made of the operation of this embodied example of the present invention.

When the modulating wave signal Vm in the equation (1) mentioned above is input from the input terminal 11 and the carrier wave signal Vc in the equation (1) is input from the input terminal 12, the output voltage Vo in the equation (2) mentioned above is output, only the sum and difference components of the frequencies of the input signals Vm and Vc appear, and thus, frequency conversion has been done. The operation of the frequency conversion is the same as in the prior-art example, and its description will be omitted.

If the voltage drop of the resistors R16 and R17 is VR', the collector-emitter voltage of the transistors Q16 and Q20 is 0.4 V, the minimum operating voltage $Vcc_{MIN}$ of the circuit of this embodiment can be obtained as:

$$Vcc_{MIN} = Vce(Q16) + Vce(Q20) + VR'$$
$$= 0.8V + VR'(V) \quad (4)$$

In this equation (4), if VR'=1 V, $Vcc_{MIN}$=1.8 V.

In other words, a supply voltage of 1.8 V is enough to operate this balanced modulation circuit. In comparing the equations (3) and (4), if the supply voltage Vcc is the same, the equation (4) permits a greater voltage drop of the resistors by 0.4 V, and therefore, provide a wider output dynamic range.

Therefore, the balanced modulation circuit according to this embodiment is the most suitable circuit for a low-voltage-driven integrated stage of carrier removal type modulation circuits, frequency low-band conversion circuits, high-band conversion circuits, etc. in communication and transmission systems.

Many widely different embodiments of the present invention may be constructed without departing from the spirit and scope of the present invention. It should be understood that the present invention is not limited to the specific embodiments described in the specification, except as defined in the appended claims.

What is claimed is:

1. A balanced modulation circuit comprising first, second, and third differential amplifiers, said first differential amplifier including first and second transistors (Q11, Q12) having the emitters connected to first and second constant-current sources and also connected with each other through a resistor, the collectors connected to the power supply line through respective base-collector-coupled transistors (Q13, Q14) used as diodes, and the bases connected to a first voltage source through respective resistors, said second differential amplifier including third and fourth transistors (Q17, Q18) having the emitters connected to the collector of a transistor (Q15) whose base is connected to the base of one (Q14) of said two base-collector-coupled transistors used as diodes and whose emitter is connected to said power supply line, the bases of said third and fourth transistors (Q17, Q18) are connected to a second voltage source through respective resistors, and the collectors are connected to the ground line through respective resistors, said third differential amplifier including fifth and sixth transistors (Q19, Q20) having the emitters connected to the collector of a transistor (Q16) whose base is connected to the base of the other (Q13) of said two base-collector-coupled transistors and whose emitter is connected to said power supply line, the bases of said fifth and sixth transistors (Q19, Q20) are respectively connected to the bases of said fourth and third transistors (Q18, Q17) of said second differential amplifier, and the collectors are respectively connected to the collectors of said third and fourth transistors (Q17, Q18) of said second differential amplifier.

2. A balanced modulation circuit as claimed in claim 1, wherein an input terminal for receiving a modulating wave signal is connected to the base of said first transistor (Q11) through a coupling capacitor.

3. A balanced modulation circuit as claimed in claim 1, wherein an input terminal for receiving a carrier wave signal is connected to the base of said third transistor (Q17) through a coupling capacitor.

4. A balanced modulation circuit as claimed in claim 1, wherein an output terminal is connected to the collector of said sixth transistor (Q20).

* * * * *